(12) United States Patent
D'Abreu et al.

(10) Patent No.: US 9,329,934 B2
(45) Date of Patent: *May 3, 2016

(54) DATA STORAGE DEVICE AND METHOD TO CORRECT BIT VALUES USING MULTIPLE READ VOLTAGES

(71) Applicant: SANDISK TECHNOLOGIES INC., Plano, TX (US)

(72) Inventors: Manuel Antonio D'Abreu, El Dorado Hills, CA (US); Stephen Skala, Freemont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/698,626

(22) Filed: Apr. 28, 2015

(65) Prior Publication Data

US 2015/0242270 A1 Aug. 27, 2015

Related U.S. Application Data

(63) Continuation of application No. 13/234,011, filed on Sep. 15, 2011, now Pat. No. 9,047,210.

(51) Int. Cl.
*G11C 29/00* (2006.01)
*G06F 11/10* (2006.01)
*G11C 29/52* (2006.01)

(52) U.S. Cl.
CPC ........ *G06F 11/1068* (2013.01); *G06F 11/1048* (2013.01); *G11C 29/52* (2013.01)

(58) Field of Classification Search
CPC ............... G06F 11/1048; G11C 2029/0411; G11C 13/0007; G11C 13/0061; G11C 13/0069; G11C 2013/0073; G11C 29/52

USPC .......... 714/763, 766, 784, 782, 805; 365/148, 365/189.04, 200
See application file for complete search history.

(56) References Cited

U.S. PATENT DOCUMENTS 7,443,734 B2 10/2008 Shibata
7,526,715 B2 4/2009 Litsyn et al.
(Continued)

FOREIGN PATENT DOCUMENTS

WO 2011024015 A1 3/2011

OTHER PUBLICATIONS

International Search Report and Written Opinion in International Application No. PCT/US2012/052889, mailed Nov. 20, 2012, 10 pages.

(Continued)

*Primary Examiner* — Guy Lamarre
(74) *Attorney, Agent, or Firm* — Toler Law Group, PC

(57) ABSTRACT

A data storage device includes a memory including a group of storage elements. The memory is configured to read the group of the storage elements. A controller is coupled to the memory. The controller is configured to, in response to a first error correction code (ECC) procedure determining that a first plurality of bit values obtained using a first read voltage to read the group of storage elements is uncorrectable, instruct the memory to read the group of the storage elements using a second read voltage to obtain a second plurality of bit values. The controller is further configured to compare the first plurality of bit values with the second plurality of bit values to identify a first set of bits having different values in the first plurality of bit values as compared to the second plurality of bit values and to change one or more values of the first plurality of bit values for one or more bits in the first set of bits to generate a first plurality of corrected bit values.

20 Claims, 7 Drawing Sheets

(56) References Cited

U.S. PATENT DOCUMENTS

| | | | |
|---|---|---|---|
| 9,047,210 B2* | 6/2015 | D'Abreu et al. | |
| 2007/0091677 A1 | 4/2007 | Lasser et al. | |
| 2008/0056005 A1 | 3/2008 | Aritome | |
| 2009/0292972 A1 | 11/2009 | Seol et al. | |
| 2010/0165730 A1 | 7/2010 | Sommer et al. | |
| 2011/0066899 A1 | 3/2011 | Kang et al. | |
| 2011/0228604 A1 | 9/2011 | Eli et al. | |

OTHER PUBLICATIONS

Non-Final Office Action mailed Sep. 5, 2013 in U.S. Appl. No. 13/234,011, 12 pages.

Non-Final Office Action mailed May 21, 2014 in U.S. Appl. No. 13/234,011, 4 pages.

International Preliminary Report on Patentability for International Application No. PCT/US2012/052889, issued Mar. 27, 2014, 5 pages.

Notice of Allowance and Fee(s) Due mailed Jan. 30, 2015 in U.S. Appl. No. 13/234,011, 5 pages.

Notice of Allowance and Fee(s) Due mailed Feb. 11, 2014 in U.S. Appl. No. 13/234,011, 6 pages.

Final Office Action mailed Sep. 23, 2014 in U.S. Appl. No. 13/234,011, 6 pages.

* cited by examiner

DATA STORAGE DEVICE AND METHOD TO CORRECT BIT VALUES USING MULTIPLE READ VOLTAGES

CROSS REFERENCE TO RELATED APPLICATIONS

The present application is a continuation of and claims priority from U.S. application Ser. No. 13/234,011, filed Sep. 15, 2011, now issued as U.S. Pat. No. 9,047,210, which is incorporated by reference herein in its entirety.

FIELD OF THE DISCLOSURE

The present disclosure is generally related to data storage and retrieval.

BACKGROUND

Error detection and correction processes help maintain data integrity within memory storage devices. Error correction code (ECC) processes are commonly used for error detection in computer memory subsystems. For example, an ECC may be used during a read operation to determine whether accessed data bits (e.g., memory cells representing information retrieved by a processor) have incorrect values. ECC processing may increase operational reliability of memory devices by detecting a number of erroneous bits and correcting the erroneous bits based on the correction capacity of the particular ECC technique that is applied. Despite the advances afforded by use of the ECC, it would be desirable to be able to correct a number of errors that exceeds a correction capacity of an applied ECC technique.

SUMMARY

Systems and methods are disclosed that can identify and correct errors within stored or transmitted data. A particular embodiment may obtain first data by reading a group of storage elements within a memory using a first voltage and initiating an error correction code (ECC) procedure on the first data. In response to an ECC procedure indicating that the first data is uncorrectable by the ECC procedure, second data may be obtained by reading the same group of storage elements using a second voltage that is different than the first voltage. A comparison of the first data and the second data may identify bits having different values between the first data and the second data. Corrected bit values may be generated by changing one or more bit values of the first data to corresponding values of the second data. After one or more bits are flipped, the ECC procedure is initiated again to determine whether a sufficient number of bits have been corrected to enable ECC correction of any remaining bit errors.

DETAILED DESCRIPTION

Figure 1:
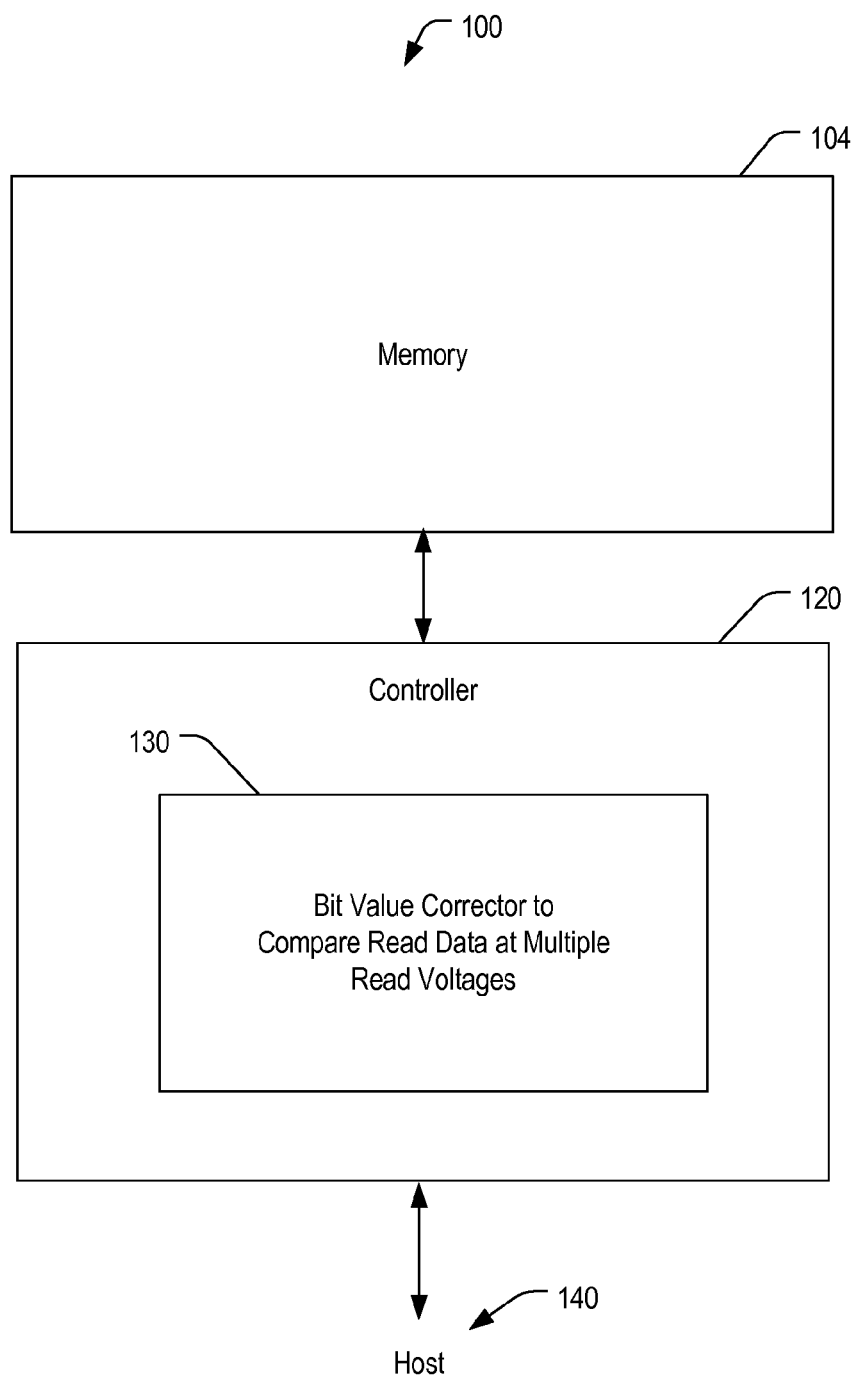
FIG. 1 is a block diagram of a particular illustrative embodiment of a system to correct bit values using multiple read voltages.

Referring to FIG. 1, a particular illustrative embodiment of a system to correct bit values using multiple read voltages is depicted and generally designated 100. The system 100 includes a memory 104 coupled to a controller 120. The controller 120 is coupled to a host device 140.

The host device 140 may be configured to provide data to be stored at the memory 104 or to request data to be read from the memory 104. For example, the host device 140 may include a mobile telephone, a music or video player, a gaming console, an electronic book reader, a personal digital assistant (PDA), a computer such as a laptop computer or notebook computer, any other electronic device, or any combination thereof.

The memory 104 may be a non-volatile memory and may include a plurality of storage elements such as flash memory cells of a multi-level cell (MLC) flash memory. The memory 104 may be configured to read a group of the storage elements, such as a page of multi-level cells, using a read voltage to obtain a plurality of bit values and to transfer the plurality of bit values to the controller 120.

The controller 120 includes a bit value corrector comparing read data at multiple read voltages 130. The bit value corrector is configured to compare read data at multiple read voltages 130 and to generate corrected data based on data that is generated at different read voltages. For example, the controller 120 may perform one or more attempts to correct and decode data from the group of storage elements.

During operation, the host device 140 may instruct the controller 120 to retrieve data corresponding to the group of storage elements from the memory 104. The memory 104 may read the group of storage elements using a first read voltage to obtain a first plurality of bit values and provide the first plurality of bit values to the controller 120. The controller 120 may initiate a first ECC procedure on the first plurality of bit values. In response to the first ECC procedure determining that the first plurality of bit values is not correctable, the controller 120 may instruct the memory 104 to read the same group of storage elements using a second read voltage having a relatively small change in voltage as compared to the first read voltage to obtain a second plurality of bit values. The controller 120 may compare the first plurality of bit values with the second plurality of bit values to identify a first set of bits having different values in the first plurality of bit values as compared to the second plurality of bit values. Accordingly, the controller 120 may, via the bit value corrector 130, compare read data at multiple read voltages 130 and generate a first plurality of corrected bit values by changing one or more values of the first plurality of bit values to corresponding values of the second plurality of bit values. For example, after one or more bits are flipped (i.e., changed from a "0" value to a "1" value or from a "1" value to a "0" value), the controller 120 may initiate a second ECC procedure on the first plurality of corrected bit values to determine whether the one or more bits were flipped correctly.

In response to the second ECC procedure determining that the first plurality of corrected bit values is not correctable, the controller 120 may instruct the memory 104 to read the same group of storage elements using a third read voltage having a relatively small change in voltage as compared to the second read voltage to obtain a third plurality of bit values. The controller 120 may compare the second plurality of bit values with the third plurality of bit values to identify a second set of bits having different values in the second plurality of bit values as compared to the third plurality of bit values. Accordingly, the controller 120 may, via the bit value corrector 130, compare read data at multiple read voltages 130 and generate a second plurality of corrected bit values by changing one or more values of the second plurality of bit values to corresponding values of the third plurality of bit values. The controller 120 may initiate a third ECC procedure on the second plurality of corrected bit values to determine whether one or more bits that were flipped when generating the second plurality of corrected bit values were flipped correctly.

By identifying bits having changed values with relatively small changes of the read voltage as likely to be erroneous, the controller 120 may correct a sufficient number of erroneous bits to enable the controller 120 to successfully decode data read from the memory 104. To illustrate, in the event that the second ECC procedure determines that the first plurality of corrected bit values is not correctable, additional reads may be performed using different read voltages, and additional pluralities of corrected bit values may be generated until an ECC procedure is successful. Alternatively, the controller may impose a limit to a number of successive ECC procedures that may be attempted based on different read voltages. For example, the limit may be associated with an ECC procedure threshold, such as a predetermined number of ECC procedures or a timeout.

Figure 2:
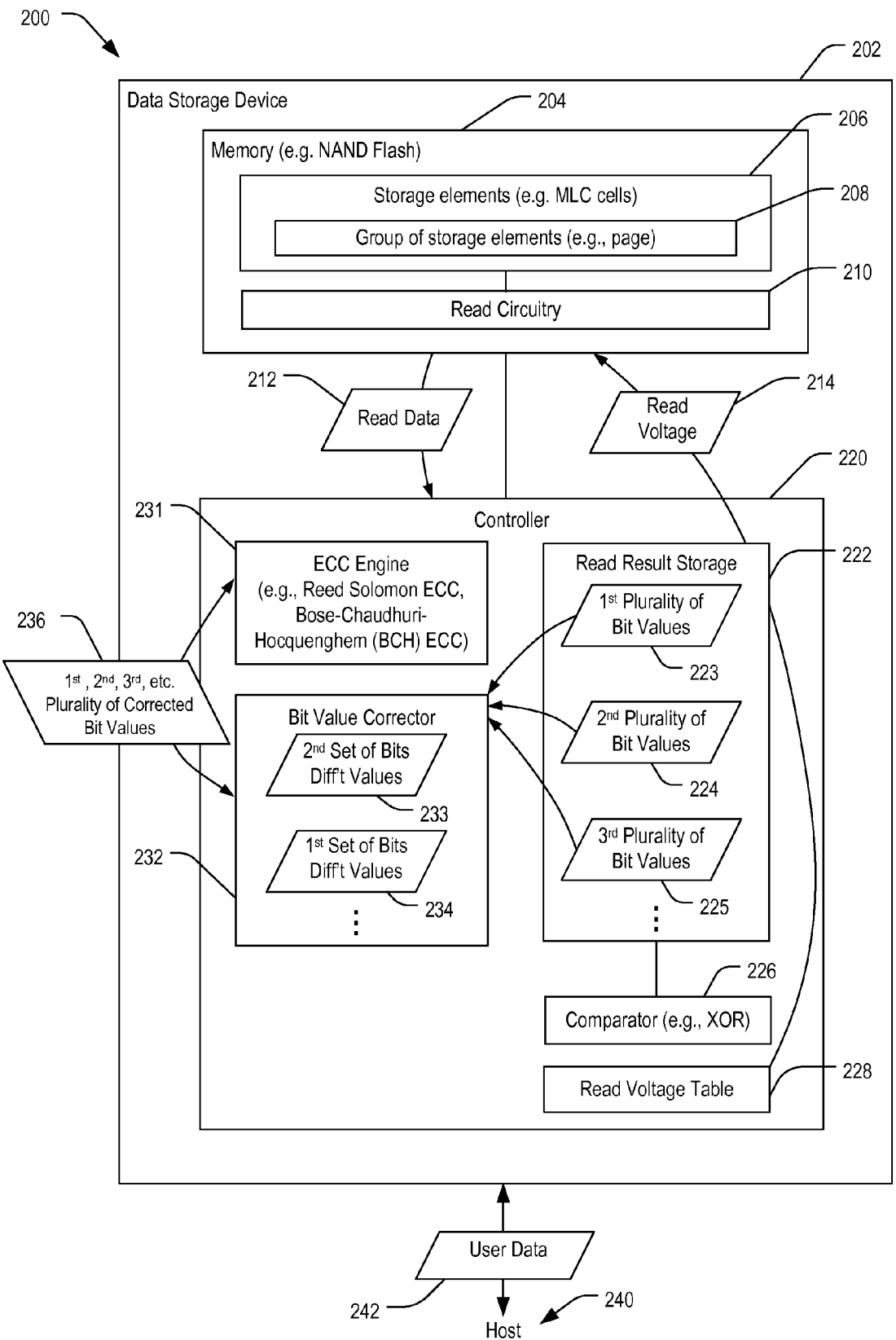
FIG. 2 is a block diagram illustrating a particular embodiment of a system that includes a data storage device to correct bit values using multiple read voltages.

Referring to FIG. 2, a particular illustrative embodiment of a system to correct bit values using multiple read voltages is depicted and generally designated 200. The system 200 includes a data storage device 202 coupled to a host device 240. The data storage device 202 includes a memory 204 and a controller 220 that includes a bit value corrector 232. In a particular embodiment, the bit value corrector 232 may correspond to the bit value corrector 130 of FIG. 1.

The data storage device 202 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 202 may be configured to be coupled to the host device 240 as embedded memory, such as eMMC® (trademark of JEDEC Solid State Technology Association, Arlington, Va.) and eSD, as illustrative examples. As another illustrative example, the data storage device 202 may include a hard disk drive that includes one or more rotating platters for data storage.

The memory 204 includes a plurality of storage elements 206. The memory 204 is configured to read a group 208 of the storage elements 206, such as a page of multi-level cell (MLC) cells. For example, the memory 204 may be a NAND flash memory. The memory 204 also includes read circuitry 210. The read circuitry 210 may be configured to read the group 208 of the storage elements 206 using a read voltage 214 to obtain a first plurality of bit values. For example, the first plurality of bit values may be provided to the controller 220 as read data 212.

The controller 220 includes an ECC engine 231, a read result storage 222, the bit value corrector 232, a comparator 226, and a read voltage table 228. The controller 220 may be configured to initiate a first error correction code (ECC) procedure on the read data 212 by providing the read data 212 to the ECC engine 231. For example, the ECC engine 231 may employ an ECC decoding scheme, such as a Reed Solomon ECC, a Bose-Chaudhuri-Hocquenghem (BCH) ECC, one or more other ECC decoding schemes, or any combination thereof.

The controller 220 may further be configured to store one or more sets of bit values, such as a first plurality of bit values 223, a second plurality of bit values 224, and a third plurality of bit values 225, in response to one or more of the sets of bit values 223-225 resulting in a decoding error at the ECC engine 231. For example, when the first plurality of bit values 223 has a number of bit errors exceeding a correction capability of the ECC engine 231, the ECC engine 231 may generate an error signal indicating that the first plurality of bit values 223 is not decodable. In response, the controller 220 may be configured to instruct the memory 204 to perform another read operation using a different read voltage 214 that may be retrieved from the read voltage table 228. For example, the controller 220 may instruct the memory 204 to read the group 208 of the storage elements 206 using a second read voltage retrieved from the read voltage table 228 to obtain a second plurality of bit values.

The bit value corrector 232 is configured to generate one or more sets of corrected bit values 236 using two or more of the sets of bit values 223-225 that are generated at different read voltages. For example, the bit value corrector 232 may be configured to provide the first plurality of bit values 223 and the second plurality of bit values 224 to the comparator 226. The comparator 226 is configured to generate a first set of bits having different values 234 in response to comparing the first plurality of bit values 223 as compared to the second plurality of bit values 224. Bits of the first set of bits having different values 234 may be indicative of storage elements of the group 208 having a state near a border between states, indicated by a change in value (e.g., a change from a "0" to a "1" or a change from a "1" to a "0") with differing values of the read voltage 214. Bits identified in the first set of bits having different values 234 may be more likely to be erroneous than bits that have the same value in the first plurality of bit values 223 and the second plurality of bit values 224. Based on the bits of the first set of bits having different values 234, the bit value corrector 232 may be configured to generate a first plurality of corrected bit values 236 by changing one or more of the first plurality of bit values 223 to corresponding values of the second plurality of bit values 224. Alternatively, the bit value corrector 232 may be configured to generate the first plurality of corrected bit values 236 by flipping one or more of the bits with different values 234.

The controller 220 may be configured to perform a read at the memory 204, store the read data 212 resulting from the read to the read result storage 222, determine a set of bits exhibiting a change of bit values as a result of a change in a read voltage from a previous read, and generate a plurality of corrected bit values 236 for a subsequent attempt of decoding at the ECC engine 231, as further described with reference to FIG. 3. The controller 220 identifies bits read from the storage elements 206 of the group of storage elements 208 that may be more likely to be erroneous due to the storage elements having states near borders between defined state values. By identifying bits that are likely to be erroneous, the controller 220 may correct a sufficient number of erroneous bits to enable the ECC engine 231 to perform a successful correction decoding of the plurality of corrected bit values 236. For example, the controller 220 may make one or more attempts to correct and decode data from or related to the group 208 of storage elements or the plurality of corrected bit values 236 even though the number of bit errors occurring in the data exceeds the error correction capability of the ECC engine 231. Although the controller 220 may not detect and correct all bit errors appearing in the read data 212 via the bit value corrector 232, the controller 220 may correct a sufficient number of erroneous bits to enable the ECC engine 231 to perform a successful correction decoding of the plurality of corrected bit values 236.

During operation, the controller 220 may be instructed by the host device 240 to retrieve data corresponding to the group 208 of storage elements. In response, the controller 220 may retrieve a first read voltage 214 from the read voltage table 228 and provide an instruction to the memory 204 to retrieve the read data 212 by reading the group 208 of storage elements according to the first read voltage 214. The controller 220 may provide the read data 212 to the ECC engine 231. In response to the read data 212 having bit errors exceeding the error correction capability of the ECC engine 231, the controller 220 may store the read data 212 as the first plurality of bit values 223 in the read result storage 222.

The controller 220 may further retrieve a next value of the read voltage 214 from the read voltage table 228 and instruct the memory 204 to perform another read of the group 208 of storage elements according to the newly retrieved read voltage 214. For example, as described in further detail with respect to FIGS. 4-5, errors in a lower page of an MLC memory may be caused by program disturb, causing cells in an erase state to be read as cells in a programmed state. As a result, when reading a lower page of an MLC memory, a program disturb may be suspected to be the cause of at least some of the errors in the lower page. The next read voltage 214 to be applied to the memory 204 may therefore be selected from the read voltage table 228 to have a higher voltage than the first read voltage 214 to compensate for program disturb effects. As another example, as described in further detail with respect to FIGS. 4-5, errors in an upper page of an MLC memory may be caused by data retention effects, causing cells programmed to a highest threshold state to be read as being in a lower threshold voltage state. As a result, when reading an upper page of the MLC memory, data retention effects may be suspected to be the cause of at least some of the errors in the upper page. The next read voltage 214 to be applied to the memory 204 may therefore be selected from the read voltage table 228 to have a lower voltage than the first read voltage 214.

In response to the instruction from the controller 220 using the next read voltage 214, the memory 204 may return a second set of read data 212 to the controller 220. The controller 220 may store the second set of read data 212 as the second plurality of bit values 224 in the read result storage 222. The controller 220 may provide the first plurality of bit values 223 and the second plurality of bit values 224 to the comparator 226 to generate the first set of bits having different values 234 for use at the bit value corrector 232. For example, the comparator 226 may perform a bit-wise exclusive-OR (XOR) operation on the first plurality of bit values 223 and the second plurality of bit values 224 to generate a set of bits having a "0" value for bits that are the same and a "1" value for bits that differ between the first plurality of bit values 223 and the second plurality of bit values 224. The bit value corrector 232 may identify one or more bits of the first plurality of bit values 223 to be corrected based on the first set of bits having different values 234 and may separate and send the first plurality of corrected bit values 236 to the ECC engine 231. For example, the first set of bits having different values 234 may include a series of "1" values indicating bits that changed value between the first plurality of bit values 223 at the first read voltage 214 and the second plurality of bit values 224 at the second read voltage 214. The first plurality of corrected bit values may be generated by changing one or more values of the first plurality of bit values 223 to corresponding values of the second plurality of bit values 224.

The ECC engine 231 may perform a decoding operation of the first plurality of corrected bit values 236 and, in response to the first plurality of corrected bit values 236 being decodable, may return user data 242 to the host device 240. However, in the event that the first plurality of corrected bit values 236 also has a number of bit errors exceeding the correction capability of the ECC engine 231, the controller 220 may read another voltage from the read voltage table 228 and instruct the memory 204 to perform another read operation of the group 208 of storage elements with the most recently retrieved read voltage 214 (e.g., another value of the read voltage). In response, the memory 204 may retrieve a third instance of the read data 212 corresponding to the third value of the read voltage 214, and the third instance of the read data 212 may be stored by the controller 220 as the third plurality of bit values 225.

The controller 220 may provide the third plurality of bit values 225 to the bit value corrector 232, to generate the second set of bits having different values 233. For example, the bit value corrector 232 may employ a majority selection process to select a value for bits that have different values in one or more of the first, the second, and the third pluralities of bit values 223, 224, and 225. The bit value corrector 232 may output a second plurality of corrected bit values 236 based on the second set of bits having different values 233, and the second plurality of corrected bit values 236 may be provided to the ECC engine 231 for a subsequent attempt of ECC decoding.

The controller 220 may provide a fourth plurality of bit values (not shown) to the bit value corrector 232, to generate a third set of bits having different values (not shown). For example, the bit value corrector 232 may employ a majority selection process to select a value for bits that have different values in one or more of the second plurality of bit values 224, the third plurality of bit values 225, and the fourth plurality of bit values (not shown). The bit value corrector 232 may output a third plurality of corrected bit values 236 based on the third set of bits having different values, and the third plurality of corrected bit values 236 may be provided to the ECC engine 231 for a subsequent attempt of ECC decoding.

Accordingly, the controller 220 may be configured to perform a read at the memory 204, store the read data 212 resulting from the read to the read result storage 222, determine a set of bits having a change of bit values as a result of a change in a read voltage from a previous read, and generate a plurality of corrected bit values 236 for a subsequent attempt of decoding at the ECC engine 231. By identifying bits that are likely to be erroneous as exhibiting a change of value in response to a small change in the read voltage 214, the controller 220 may correct a sufficient number of erroneous bits to enable the ECC engine 231 to perform a successful correction decoding of the plurality of corrected bit values 236.

In the event that the subsequent attempt of decoding at the ECC engine 231 determines that the plurality of corrected bit values 236 is not correctable, additional reads may be performed using different read voltages and additional pluralities of corrected bit values 236 may be generated until an ECC procedure is successful. Alternatively, the controller may impose a limit to a number of successive ECC procedures that may be attempted based on different read voltages. For example, the limit may be associated with an ECC procedure threshold, such as a predetermined number of ECC procedures or a timeout.

Figure 3A:
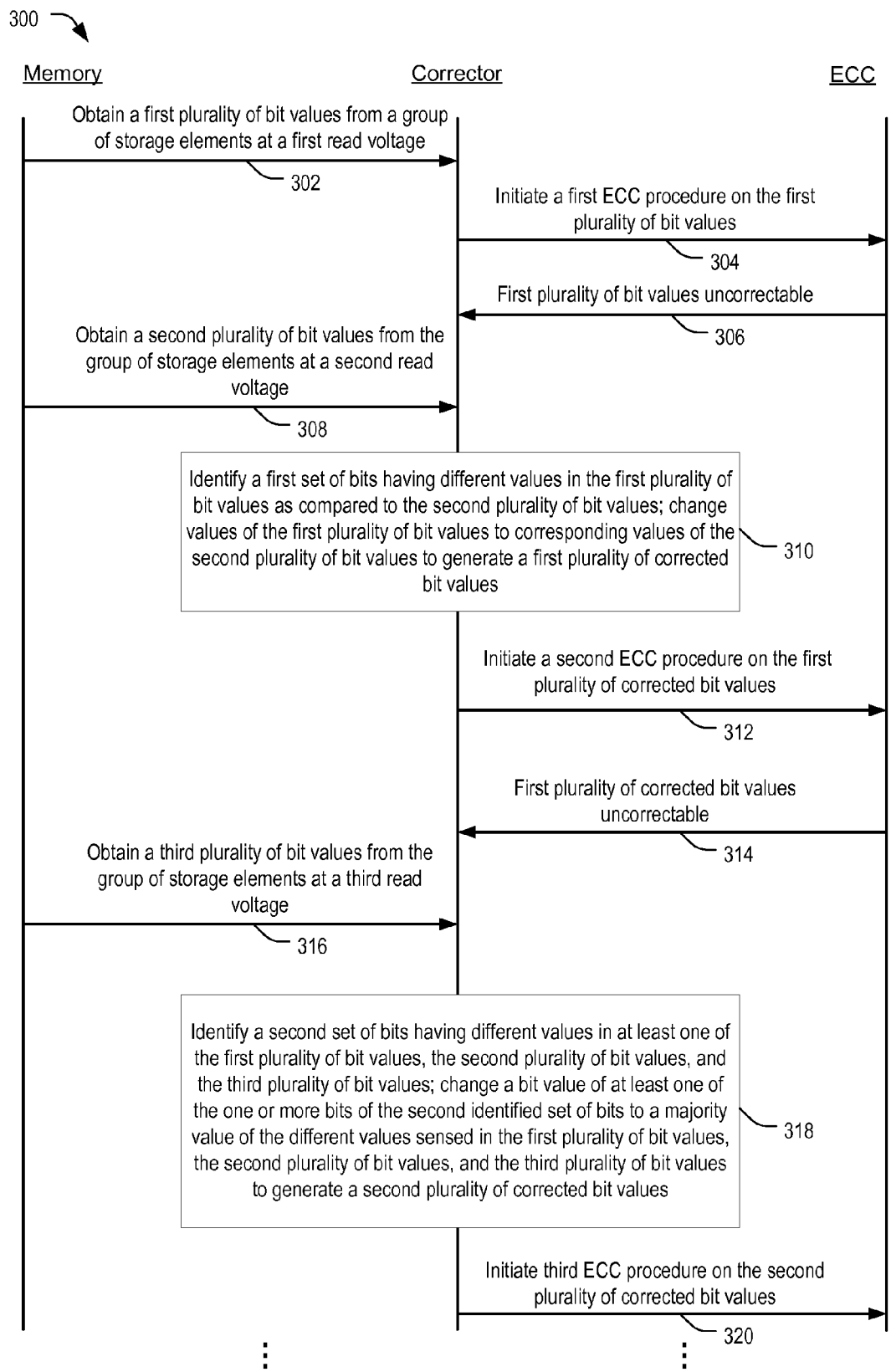
FIGS. 3A and 3B are a sequence diagram of a particular illustrative embodiment of a method to correct bit values using multiple read voltages.
Figure 3B:
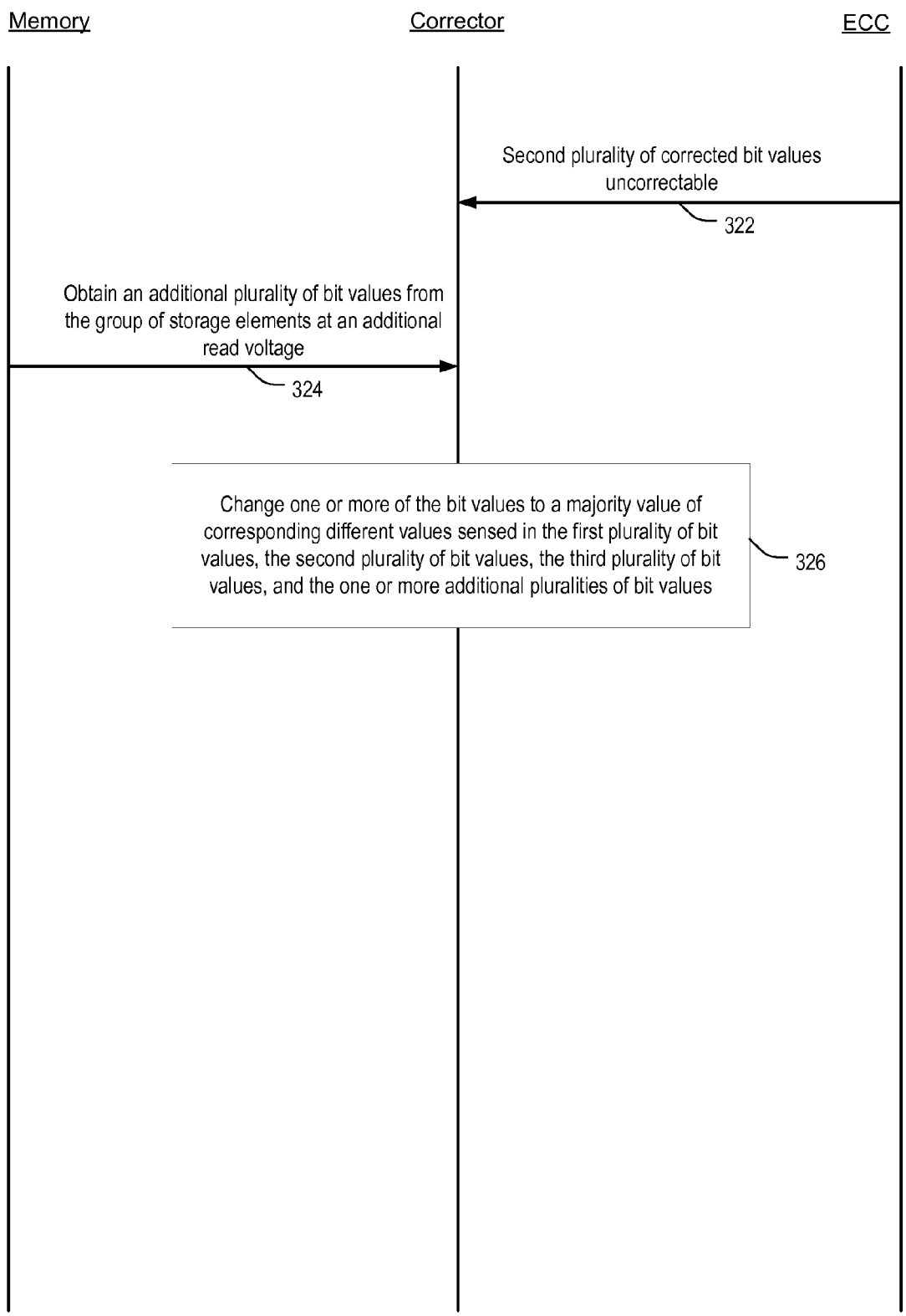

Referring to FIGS. 3A and 3B, a sequence diagram is depicted and illustrates a particular embodiment of a method of correcting bit values using multiple read voltages and is generally designated 300. The sequence diagram 300 shows messaging between a memory, a controller including a bit value corrector, and an ECC engine, such as the memory 204, the controller 220 including the bit value corrector 232, and the ECC engine 231 of FIG. 2. The sequence diagram 300 includes obtaining a first plurality of bit values from a group of storage elements at a first read voltage, at 302. The first plurality of bit values from the group of storage elements may be obtained from the memory 204. For example, the controller 220 within the data storage device 200 may be instructed by the host device 240 to retrieve data corresponding to the group 208 of storage elements. The controller 220 may retrieve a first read voltage 214 from the read voltage table 228 and provide an instruction to the memory 204 to retrieve the read data 212 by reading the group 208 of storage elements according to the read voltage 214. The memory 204 may obtain the first plurality of bit values and may provide the plurality of bit values to the controller 220.

An error correction code (ECC) procedure is initialized on the first plurality of bit values, at 304. For example, the controller 220 may be configured to provide the read data 212 to the ECC engine 231. In response to the ECC procedure indicating that the first plurality of bit values is correctable, data is returned to the host device 240 and decoding of a next plurality of bit values read from the memory may begin. Otherwise, in response to the ECC procedure indicating that the first plurality of bit values is uncorrectable by the ECC procedure, at 306, a second plurality of bit values is obtained from the group of storage elements at a second read voltage, at 308. For example, in response to the read data 212 having bit errors exceeding the error correction capability of the ECC engine 231, the controller 220 may store the read data 212 as the first plurality of bit values 223 in the read result storage 222. The controller 220 may further retrieve a second value of the read voltage 214 from the read voltage table 228 and instruct the memory 204 to perform a second read of the group 208 of storage elements according to the second value of the read voltage 214. In response to the instruction from the controller 220, the memory 204 may return a second set of read data 212 to the controller 220. The controller 220 may store the second set of read data as the second plurality of bit values 224 in the read result storage 222.

A first set of bits having different values in the first plurality of bit values as compared to the second plurality of bit values is identified, and values of the first plurality of bit values are changed to corresponding values of the second plurality of bit values to generate a first plurality of corrected bit values, at 310. For example, the bit value corrector 232 may be configured to provide the first plurality of bit values 223 and the second plurality of bit values 224 to the comparator 226 to generate the first set of bits having different values 234 in the first plurality of bit values 223 as compared to the second plurality of bit values 224. The bit value corrector 232 is configured to generate one or more sets of corrected bit values 236 using two or more of the sets of bit values 223-225 that are generated at different read voltages. The bit value corrector 232 may identify one or more bits of the first plurality of bit values 223 to be corrected based on the first set of bits having different values 234 and may generate and send the first plurality of corrected bit values 236 to the ECC engine 231, illustrated in the sequence diagram 300 as initiating a second ECC procedure on the first plurality of corrected bit values, at 312. For example, the ECC engine 231 may perform a decoding operation of the first plurality of corrected bit values 236.

In response to the second ECC procedure indicating that the first plurality of corrected bit values is correctable, data is returned to the host device 240 and decoding of a next plurality of bit values read from the memory may begin. Otherwise, in response to the second ECC procedure indicating that the first plurality of corrected bit values is uncorrectable, at 314, a third plurality of bit values from the group of storage elements at a third read voltage is obtained, at 316. For example, if the first plurality of corrected bit values 236 has a number of bit errors exceeding the correction capability of the ECC engine 231, the controller 220 may read a third voltage from the read voltage table 228 and instruct the memory 204 to perform a third read operation of the group 208 of storage elements with the third read voltage 214. In response, the memory 204 may retrieve a third instance of the read data 212 corresponding to the third value of the read voltage 214. The third instance of the read data 212 may be stored by the controller 220 as the third plurality of bit values 225.

A second set of bits having different values in at least one of the first plurality of bit values, the second plurality of bit values, and the third plurality of bit values is identified, and a bit value of each of the one or more bits of the second identified set of bits is changed to a majority value of the different values sensed in the first plurality of bit values, the second plurality of bit values, and the third plurality of bit values to generate a second plurality of corrected bit values, at 318. For example, the controller 220 may provide the third plurality of bit values 225 to the bit value corrector 232, which may generate the second set of bits having different values 233. The bit value corrector 232 may employ a majority selection process by locating one or more bits of the first plurality of bit values 223, the second plurality of bit values 224, and the third plurality of bit values 225 that transition between one of the first, the second, and the third pluralities of bit values 223-225. For example, if a particular bit has a "1" value in the first plurality of bit values 223, a "0" value in the second plurality of bit values 224, and a "0" value in the third plurality of bit values 225, the particular bit may be changed to a "0" value based on the majority selection process. The bit value corrector 232 may output a second plurality of corrected bit values 236 based on the second set of bits having different values 233, which may be provided to the ECC engine 231 for a subsequent attempt of ECC decoding, illustrated as initiating a third ECC procedure on the second plurality of corrected bit values, at 320. For example, the ECC engine 231 may perform a decoding operation of the second plurality of corrected bit values 236.

In response to the third ECC procedure indicating that the second plurality of corrected bit values is correctable, data is returned to the host device 240, and decoding of a next plurality of bit values read from the memory may begin. Otherwise, in response to the third ECC procedure indicating that the second plurality of corrected bit values is uncorrectable, at 322, an additional plurality of bit values from the group of storage elements at an additional read voltage is obtained, at 324. For example, if the second plurality of corrected bit values 236 has a number of bit errors exceeding the correction capability of the ECC engine 231, the controller 220 may read an additional voltage from the read voltage table 228 and instruct the memory 204 to perform an additional read operation of the group 208 of storage elements with the additional read voltage 214. In response, the memory 204 may retrieve an additional instance of the read data 212 corresponding to the additional value of the read voltage 214, which may be stored by the controller 220 as an additional plurality of bit values (not shown).

One or more of the bit values is changed to a majority value of corresponding different values sensed in the first plurality of bit values, the second plurality of bit values, the third plurality of bit values, and the one or more additional pluralities of bit values, at 326. For example, the controller 220 may provide the additional plurality of bit values to the bit value corrector 232, which may generate the additional set of bits having different values (not shown). The bit value corrector 232 may employ a majority selection process based on values of bits of the first plurality of bit values 223, the second plurality of bit values 224, the third plurality of bit values 225, and the additional plurality of bit values.

By identifying bits that exhibit changes in bit values in response to changes in the read voltage as candidates for pre-ECC correction, the bit value corrector 232 may correct a sufficient number of erroneous bits to enable the ECC engine 231 to perform a successful correction decoding of the plurality of corrected bit values 236.

In the event that an ECC procedure determines that the plurality of corrected bit values 236 is not correctable, additional reads may be performed using different read voltages and additional pluralities of corrected bit values 236 may be generated until an ECC procedure is successful. Alternatively, the controller may impose a limit to a number of successive ECC procedures that may be attempted based on different read voltages. For example, the limit may be associated with an ECC procedure threshold, such as a predetermined number of ECC procedures or a timeout.

Figure 4:
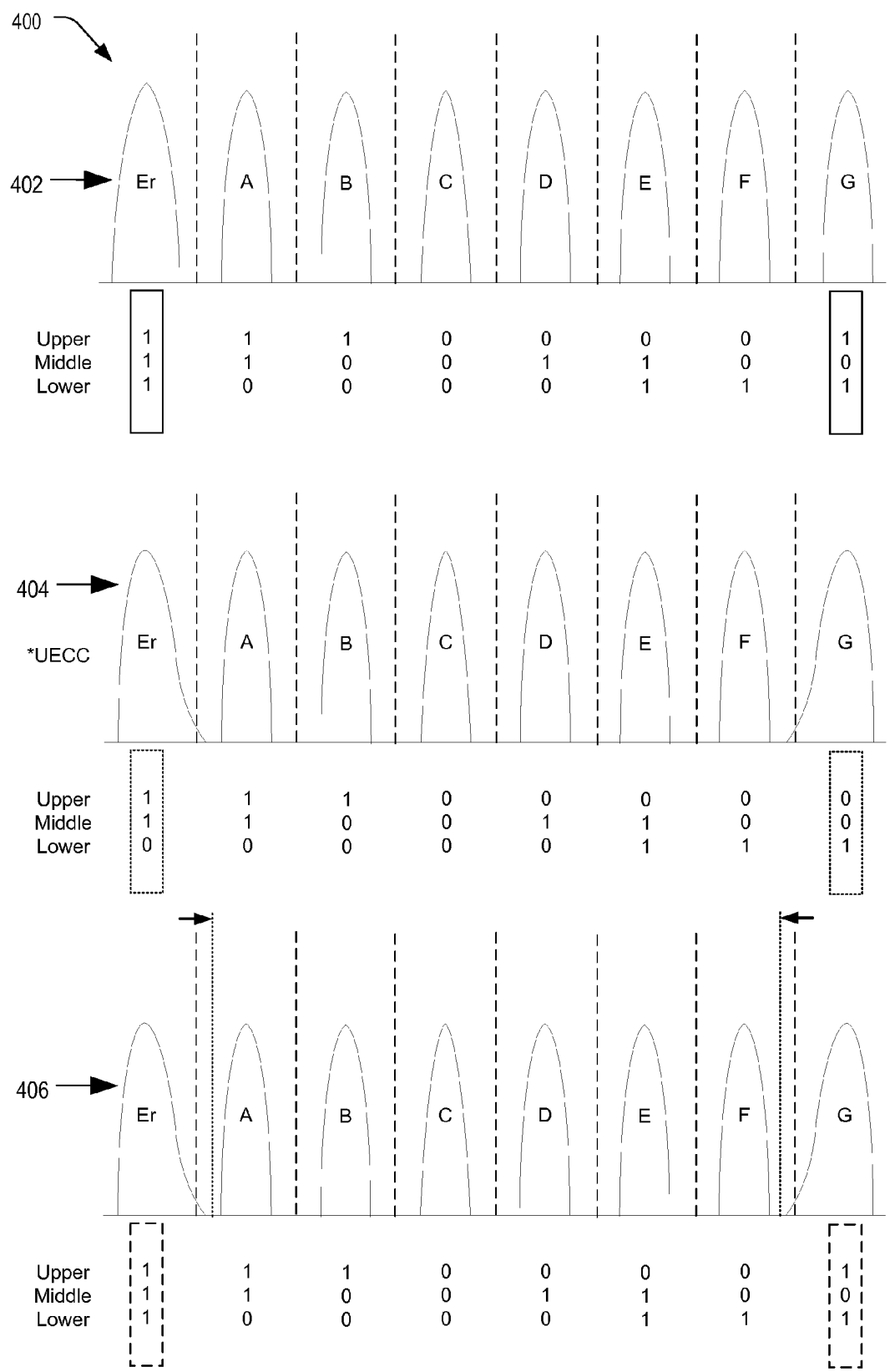
FIG. 4 is a general diagram illustrating representative voltage characteristics of a storage element of FIG. 2 and illustrating correction of bit errors by adjusting read voltages.

FIG. 4 shows representative voltage characteristics 402, 404, and 406 of a group of storage elements that may be read from a memory and illustrates an example of data corruption due to overlap in voltage threshold distributions. For example, threshold voltage characteristics read from a group of 3-bit multi-level cells is illustrated in a cell voltage distribution (CVD) 402. The CVD 402 illustrates a distribution of cells programmed to particular threshold voltages and a 3-bit value corresponding to each particular voltage range. For example, as illustrated, the CVD 402 includes eight identifiable threshold voltage ranges defined by seven read voltages ($V_{read}$) 411-417 and corresponding to cell states Er-G, respectively. For example, a 3-bit value of '111,' such as stored in upper, middle, and lower pages, respectively, corresponds to a threshold voltage within a first (i.e., less than the $V_{read}$ 411, corresponding to the "Er" state) threshold voltage range of the eight identifiable threshold voltage ranges. A 3-bit value of '110' corresponds to a threshold voltage within a second (i.e., between the $V_{read}$ 411 and the $V_{read}$ 412, corresponding to the "A" state) threshold voltage range of the eight identifiable threshold voltage ranges. A 3-bit value of '001' corresponds to a threshold voltage within a seventh (i.e., between the $V_{read}$ 416 and the $V_{read}$ 417, corresponding to the "F" state) threshold voltage range of the eight identifiable threshold voltage ranges. A 3-bit value of '101' corresponds to a threshold voltage within an eighth (i.e., greater than the $V_{read}$ 417, corresponding to the "G" state) threshold voltage range of the eight identifiable threshold voltage ranges.

Although each cell may be initially programmed to have a threshold voltage at a center of its programmed state, the actual cell threshold voltages may "drift" from a center voltage due to a variety of factors, resulting in the CVD 402. The multi-level cells may be read by comparing threshold voltages to one or more corresponding read voltages ($V_{read}$) 411-417. The CVD 402 is illustrated as having no errors (i.e., all cells remain in their originally programmed state).

Another representative threshold voltage characteristic that may be read from the group of 3-bit multi-level cells at a later time is illustrated in the CVD 404. Errors occur in the upper and lower pages for some cells originally programmed to states "G" and "Er", respectively. To illustrate, errors in the lower page may be due to programming disturbance resulting from programming nearby cells. The programming disturbance may cause the threshold voltage of cells originally programmed to the "Er" state to drift or increase beyond the read voltage $V_{read}$ 411 between the "Er" state and the "A" state as shown. Reading these cells using the read voltage $V_{read}$ 411 causes the cells to be misidentified as being in the "A" state instead of in the "Er" state. For example, the bit value in the lower page of the "Er" state may "flip" from its correct value (e.g., "1") to an erroneous value (e.g., "0").

Errors in the upper page may be due to data retention errors. The data retention errors may cause the threshold voltage of cells originally programmed to the "G" state to drift or decrease below the read voltage $V_{read}$ 417 between the "G" state and the "F" state as shown. Reading these cells using the read voltage $V_{read}$ 417 causes the cells to be misidentified as being in the "F" state instead of in the "G" state. For example, the bit value in the upper page of the "G" state may "flip" from its correct value (e.g., "1") to an erroneous value (e.g., "0").

Another representative threshold voltage characteristic read from the group of 3-bit multi-level cells is illustrated in the CVD 406, where the erroneous values in the lower and upper pages of the CVD 404 have been corrected by a small change in the read voltages corresponding to the states "Er" and "G", respectively. For example, a new read of the 3-bit multi-level cells using the read voltage $V_{read}$ 421 causes the cells in the lower page "Er" state that were misidentified as being in the "A" state when read with the read voltage $V_{read}$ 411 in the CVD 404 to be correctly identified as being in the "Er" state. To illustrate, the bit in the lower page "flips" from a value of "0" using the read voltage $V_{read}$ 411 to a value of "1" using the read voltage $V_{read}$ 421. Similarly, a new read of the 3-bit multi-level cells using the read voltage $V_{read}$ 423 causes the cells in the "G" state that were misidentified as being in the "F" state when read with the read voltage $V_{read}$ 417 in the CVD 404 to be correctly identified as being in the "G" state. To illustrate, the bit in the upper page "flips" from a value of "0" using the read voltage $V_{read}$ 417 to a value of "1" using the read voltage $V_{read}$ 423.

By performing multiple reads using different read voltages and comparing bit states between the multiple reads as described above with reference to FIG. 2 and FIG. 3, changes in bit value (e.g., a change from a "0" to a "1" or a change from a "1" to a "0") due to differing values of the read voltage may be indicative of storage elements of a group of storage elements having a state near a border between states. Bit values corresponding to such storage elements may be identified as more likely to be erroneous. By identifying storage elements of the group of storage elements that may be more likely to be erroneous, a sufficient number of erroneous bits may be corrected to enable the ECC engine to perform a successful correction decoding of the erroneous bit values, as illustrated in the CVD 406.

Figure 5:
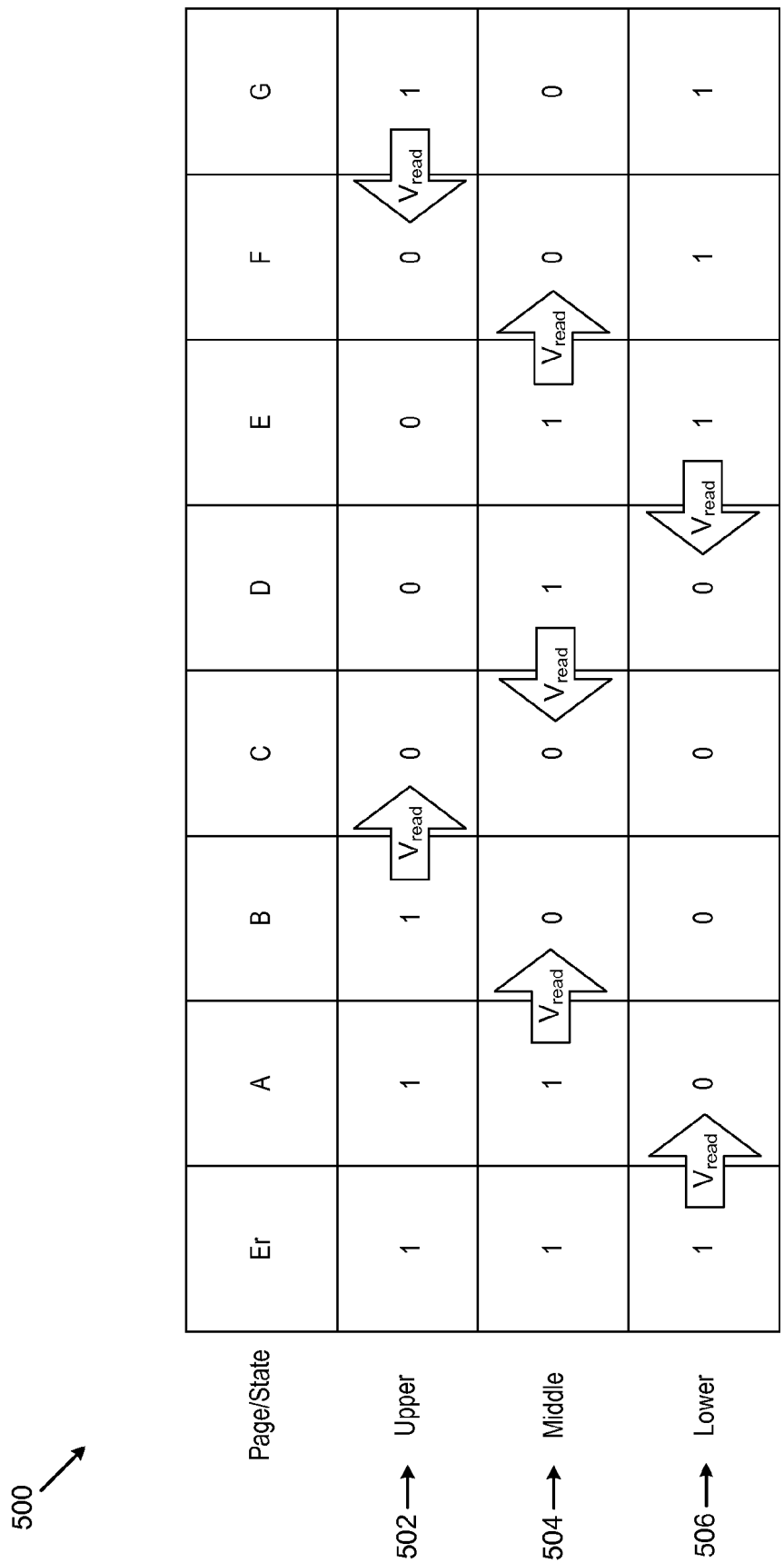
FIG. 5 is a particular illustrative embodiment of a table showing a mapping of bits to states of a storage element of FIG. 2.

Referring to FIG. 5, a particular illustrative embodiment of a table showing a mapping of bits to states of a storage element is depicted and generally designated 500. The storage element may include a multi-level cell (MLC), such as in the memory 204 of FIG. 2. The storage element is illustrated as having a set of possible states Er-G, with each state representing a different value of three bits arranged in a column format including a top bit, a middle bit, and a bottom bit. The top bit may be part of a first or upper page 502, the middle bit may be part of a second or middle page 504, and the bottom bit may be part of a third or lower page 506.

The table 500 illustrates multiple read points for each page in a 3-bit multi-level cell. For example, a pair of read points 511, 513 indicates read voltages corresponding to bit transitions in the upper page 502. The read point 511 corresponds to the read voltage 413 of FIG. 4 and the read point 513 corresponds to the read voltage 417 of FIG. 4. The read points 515, 517, and 519 indicate read voltages corresponding to bit transitions in the middle page 504. The read point 515 corresponds to the read voltage 412 of FIG. 4, the read point 517 corresponds to the read voltage 414 of FIG. 4, and the read point 519 corresponds to the read voltage 416 of FIG. 4. The read points 521, 523 indicate read voltages corresponding to bit transitions in the lower page 506. The read point 521 corresponds to the read voltage 411 of FIG. 4 and the read point 523 corresponds to the read voltage 415 of FIG. 4.

As illustrated, the table 500 includes eight identifiable states (e.g., states "Er"-"G") associated with corresponding read voltages (e.g., the read voltages ($V_{read}$) 411-417 of FIG. 4). To illustrate, a 3-bit value of '111,' (i.e., a "1" value stored in the upper, middle, and lower pages 502, 504, and 506, respectively), corresponds to bit values of cells originally set to the "Er" state. As another illustration, a 3-bit value of '110' (i.e., a "1" value stored in the upper page 502, a "1" value stored in the middle page 504, and a "0" value stored in the lower page 506), corresponds to bit values of cells originally set to the "A" state. Similarly, a 3-bit value of '100' corresponds to bit values of cells originally set to the "B" state, a 3-bit value of '000' corresponds to bit values of cells originally set to the "C" state, a 3-bit value of '010' corresponds to bit values of cells originally set to the "D" state, a 3-bit value of '011' corresponds to bit values of cells originally set to the "E" state, a 3-bit value of '001' corresponds to bit values of cells originally set to the "F" state, and a 3-bit value of '101' corresponds to bit values of cells originally programmed to the "G" state.

A bit value of the upper page 502 can be determined by reading the cell with one read voltage between the "B" state and the "C" state (i.e., the read voltage $V_{read}$ 413 of FIG. 4) and with another read voltage between the "G" state and the "F" state (i.e., the read voltage $V_{read}$ 417 of FIG. 4). Errors may occur in the upper page 502 for some cells originally programmed to the states "B" and "G", respectively. To illustrate, changes in bit value (e.g., a change from a "1" to a "0") with differing values of read voltage may be indicative of storage elements of a group of storage elements having a state near a border between states, such as storage elements having a threshold voltage near the border between the "B" state and the "C" state.

For example, after performing an error correction code (ECC) procedure on the upper page at a first read voltage (i.e., the read voltage $V_{read}$ 413 of FIG. 4), it may be determined that the bit values are uncorrectable by the ECC procedure. To illustrate, the bit value of the upper page of a cell originally programmed to state "B" may be erroneously read as a "0". In response to an uncorrectable ECC, a second read at a read voltage different than the first read may be performed. A set of bits exhibiting a change of bit values as a result of a change in the read voltage from the first read to the second read may be determined and corrected bit values may be generated for a subsequent attempt of decoding via the ECC procedure. For example, after performing a second read of the upper page 502 at a second read voltage slightly higher than the read voltage $V_{read}$ 413, a comparison between bit values of the upper page 502 read at the first read voltage (the read voltage $V_{read}$ 413) and the upper page read at the second read voltage (the voltage slightly higher than the read voltage $V_{read}$ 413) may be made to generate the corrected bit values. For example, an erroneous bit value "0" of state B may be flipped to a bit value of "1".

Bit values that change in response to small changes of the read point 511 may be indicative of storage elements of a group of storage elements having a state near a border between states (i.e., storage elements between the states "B" and "C", respectively). By identifying storage elements of the group of storage elements that may be more likely to be erroneous, a sufficient number of erroneous bits may be corrected to enable the ECC procedure to perform a successful correction decoding of the erroneous bit values. A subsequent attempt of decoding the corrected bit values may thereafter be made. A similar procedure may be used for each page at each of the multiple read points 511-521-.

Figure 6:
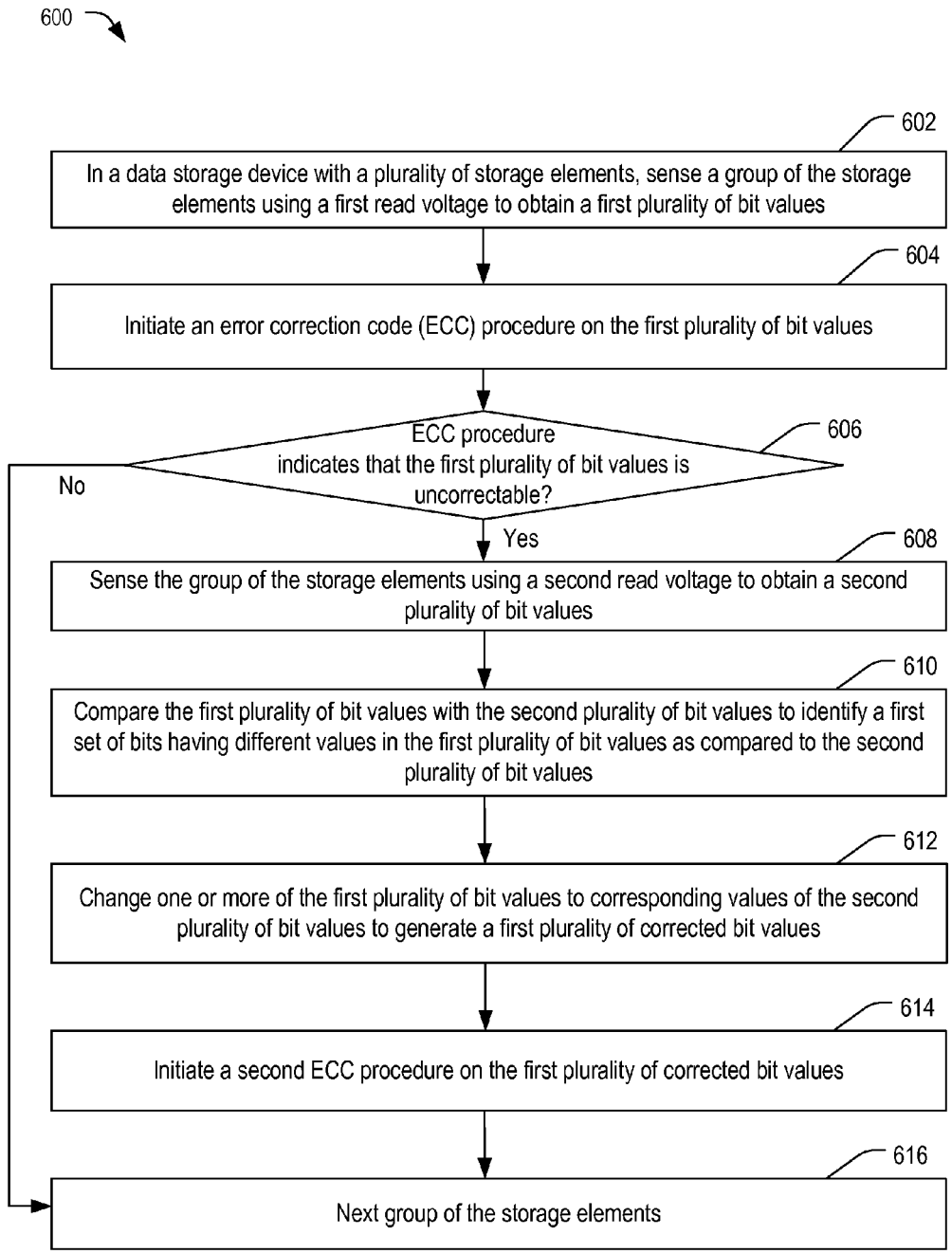
FIG. 6 is a flow chart of a particular embodiment of a method to correct bit values of multiple read voltages.

Referring to FIG. 6, a particular illustrative embodiment of a method to correct bit values using multiple read voltages is depicted and generally designated 600. The method 600 may be performed by a data storage device, such as the data storage device 200 of FIG. 2. The method 600 includes, in a data storage device with a plurality of storage elements, sensing a group of the storage elements using a first read voltage to obtain a first plurality of bit values, at 602. For example, the plurality of storage elements may be the storage elements 206 of FIG. 2 and the group of the storage elements may be the group 208 of storage elements of FIG. 2. The group 208 of storage elements may be sensed by comparing a threshold voltage of each element in the group 208 of storage elements to one or more read voltages. For example, the controller 220 within the data storage device 200 may be instructed by the host device 240 to retrieve data corresponding to the group 208 of storage elements from the memory 204. The controller 220 may retrieve a first read voltage 214 or a set of read voltages (e.g., the read voltage $V_{read}$ 411 and the read voltage $V_{read}$ 415 of FIG. 4 to read the lower page 508 of FIG. 5) from the read voltage table 228 and provide an instruction to the memory 204 to retrieve the read data 212 by reading the group 208 of storage elements according to the read voltage 214. The first plurality of bit values may be provided to the controller 220 as the read data 212.

The method 600 includes initiating an error correction code (ECC) procedure on the first plurality of bit values, at 604. For example, the controller 220 may be configured to provide the read data 212 to the ECC engine 231. In response to the ECC procedure indicating that the first plurality of bit values is correctable by the ECC procedure, at 606, the method 600 includes sensing the next group of the storage elements, at 616.

In response to the ECC procedure indicating that the first plurality of bit values is uncorrectable by the ECC procedure, at 606, the method 600 includes sensing the group of the storage elements using a second read voltage to obtain a second plurality of bit values, at 608, comparing the first plurality of bit values with the second plurality of bit values to identify a first set of bits having different values in the first plurality of bit values as compared to the second plurality of bit values, at 610, and changing one or more of the first plurality of bit values to corresponding values of the second plurality of bit values to generate a first plurality of corrected bit values, at 612.

For example, in response to the read data 212 having bit errors exceeding the error correction capability of the ECC engine 231, the controller 220 may store the read data 212 as the first plurality of bit values 223 in the read result storage 222. The controller 220 may further retrieve a second value of the read voltage 214 from the read voltage table 228 and instruct the memory 204 to perform a second read of the group 208 of storage elements according to the newly retrieved second read voltage 214. In response to the instruction from the controller 220, the memory 204 may return a second set of read data 212 to the controller 220. The controller 220 may store the second set of read data as the second plurality of bit values 224 in the read result storage 222. The bit value corrector 232 may be configured to provide the first plurality of bit values 223 and the second plurality of bit values 224 to the comparator 226. The comparator 226 may be configured to generate the first set of bits having different values 234 in the first plurality of bit values 223 as compared to the second plurality of bit values 224. Based on the first set of bits having different values 234, the bit value corrector 232 may be configured to generate the first plurality of corrected bit values 236 by changing one or more of the first plurality of bit values 223 to corresponding values of the second plurality of bit values 224.

The second read voltage may be greater than the first read voltage in response to determining that one or more bits of the identified first set of bits includes at least one bit suspected to be changed by a programming disturbance. For example, as described above with respect to FIGS. 4-5, errors in a lower page of an MLC memory may be caused by program disturb, causing cells in an erase state to be read as cells in a programmed state. As a result, when reading a lower page of an MLC memory, a program disturb may be suspected to be the cause of at least some of the errors in the lower page. The second read voltage 214 may therefore be selected (e.g. selected from the read voltage table 228) to have a higher voltage than the first read voltage 214 to compensate for program disturb effects. As another example and as illustrated in the CVD 406 of FIG. 4, the second read voltage 421 is greater than the first read voltage 411 when the ECC procedure indicates that the lower page bit in the "Er" state (e.g., one or more bits of the identified first set of bits) is suspected to be changed by a programming disturbance.

Alternatively, the second read voltage may be less than the first read voltage in response to determining that one or more bits of the identified first set of bits includes at least one bit suspected to be changed by a retention error. For example, as described above with respect to FIGS. 4-5, errors in an upper page of an MLC memory may be caused by data retention effects, causing cells programmed to a highest threshold state to be read as being in a lower threshold voltage state. As a result, when reading an upper page of the MLC memory, data retention effects may be suspected to be the cause of at least some of the errors in the upper page. The second read voltage 214 may therefore be selected (e.g. selected from the read voltage table 228) to have a lower voltage than the first read voltage 214 to compensate for data retention effects. As another example and as illustrated in the CVD 406 of FIG. 4, the second read voltage 423 is less than the first read voltage 417 when the ECC procedure indicates that the upper page bit in the "G" state (e.g., one or more bits of the identified first set of bits) is suspected to be changed by a retention error.

The method 600 includes initiating a second ECC procedure on the first plurality of corrected bit values, at 614. For example, the ECC engine 231 may perform a decoding operation of the first plurality of corrected bit values 236 and, in response to the first plurality of corrected bit values 236 being decodable, the method 600 includes sensing a next group of the storage elements, at 616.

Accordingly, the controller 220 may be configured to perform a read at the memory 204, store the read data 212 resulting from the read to the read result storage 222, determine a set of bits exhibiting a change of bit values as a result of a change in a read voltage from previous reads, and generate a plurality of corrected bit values 236 for a subsequent attempt of decoding at the ECC engine 231. By identifying bits that are likely to be erroneous as exhibiting a change of value in response to a small change in the read voltage 214, the controller 220 may correct a sufficient number of erroneous bits to enable the ECC engine 231 to perform a successful correction decoding of the plurality of corrected bit values 236, enabling use of a simpler ECC procedure which may save costs and processing time.

Although various components depicted herein are illustrated as block components and described in general terms, such components may include one or more microprocessors, state machines, or other circuits configured to enable the bit value corrector 130 of FIG. 1 or the bit value corrector 232 and the read result storage 222 of FIG. 2 to perform the particular functions attributed to such components. For example, the bit value corrector 232 of FIG. 2 may represent physical components, such as hardware controllers, state machines, logic circuits, or other structures, to enable the controller 120 of FIG. 1 or the data storage device 200 of FIG. 2 to correct values of multiple read voltages.

In a particular embodiment, the data storage device 200 may be implemented in a portable device configured to be selectively coupled to one or more external devices. However, in other embodiments, the data storage device 200 may be attached or embedded within one or more host devices, such as within a housing of a host communication device. For example, the data storage device 200 may be within a packaged apparatus such as a wireless telephone, a personal digital assistant (PDA), a gaming device or console, a portable navigation device, or other device that uses internal non-volatile memory. In a particular embodiment, the data storage device 200 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device with a group of storage elements, performing:
   in response to an error correction code (ECC) procedure indicating that a first plurality of bit values obtained using a first read voltage to read the group of storage elements is uncorrectable by the ECC procedure, causing the group of the storage elements to be read using a second read voltage to obtain a second plurality of bit values;

comparing the first plurality of bit values with the second plurality of bit values to identify a first set of bits having different values in the first plurality of bit values as compared to the second plurality of bit values; and changing one or more values for one or more bits in the first set of bits to generate a first set of corrected bit values.

2. The method of claim 1, further comprising, prior to the ECC procedure indicating that the first plurality of bit values is uncorrectable:

causing the group of storage elements to be read using the first read voltage to obtain the first plurality of bit values; and initiating the ECC procedure on the first plurality of bit values.

3. The method of claim 1, further comprising initiating a second ECC procedure on the first set of corrected bit values.

4. The method of claim 1, further comprising, in response to a second ECC procedure on the first set of corrected bit values indicating that the first set of corrected bit values is uncorrectable by the second ECC procedure:

causing the group of the storage elements to be read using a third read voltage to obtain a third plurality of bit values; and comparing the third plurality of bit values with the first plurality of bit values and the second plurality of bit values to identify a second set of bits having different values in at least one of the first plurality of bit values, the second plurality of bit values, or the third plurality of bit values.

5. The method of claim 4, further comprising changing a bit value of each of one or more bits of the second set of bits to a majority value of the different values read in the first plurality of bit values, the second plurality of bit values, and the third plurality of bit values to generate a second set of corrected bit values.

6. The method of claim 1, wherein comparing the first plurality of bit values with the second plurality of bit values includes performing an exclusive-OR operation.

7. A method comprising:

in a data storage device with a group of storage elements, performing:

causing the group of storage elements to be read using a first read voltage to obtain a first plurality of bit values;

causing the group of the storage elements to be read using a second read voltage to obtain a second plurality of bit values;

determining a first set of bits having different values in the first plurality of bit values as compared to the second plurality of bit values; and changing one or more values for one or more bits in the first set of bits to generate a first set of corrected bit values.

8. The method of claim 7, further comprising maintaining a table of read voltages, wherein the second read voltage is selected from the table.

9. The method of claim 7, further comprising:

determining a first number of bits of the first set of bits that is suspected to be changed by a program disturb error;

determining a second number of bits of the first set of bits that is suspected to be changed by a retention error; and determining whether the first number of bits is greater than the second number of bits.

10. The method of claim 7, further comprising determining a voltage value of the second read voltage prior to causing the group of storage elements to be read, wherein, in response to determining that one or more bits of the first set of bits includes at least one bit suspected to be changed by a programming disturbance, the second read voltage is determined to be a higher voltage than the first read voltage.

11. The method of claim 7, further comprising determining a voltage value of the second read voltage prior to causing the group of storage elements to be read, wherein, in response to determining that one or more bits of the first set of bits includes at least one bit suspected to be changed by a retention error, the second read voltage is determined to be a lower voltage than the first read voltage.

12. The method of claim 1, wherein the ECC procedure includes one of:

a Reed-Solomon ECC procedure; or a Bose-Chaudhuri-Hocquenghem (BCH) ECC procedure.

13. A data storage device comprising:

a memory including a group of storage elements, wherein the memory is configured to read the group of the storage elements; and a controller coupled to the memory, wherein the controller is configured to, in response to a first error correction code (ECC) procedure determining that a first plurality of bit values obtained using a first read voltage to read the group of storage elements is uncorrectable, instruct the memory to read the group of the storage elements using a second read voltage to obtain a second plurality of bit values, wherein the controller is further configured to compare the first plurality of bit values with the second plurality of bit values to identify a first set of bits having different values in the first plurality of bit values as compared to the second plurality of bit values and to change one or more values for one or more bits in the first set of bits to generate a first set of corrected bit values.

14. The data storage device of claim 13, further comprising an ECC engine configured to perform the first ECC procedure.

15. The data storage device of claim 14, wherein the ECC engine is included in the controller.

16. The data storage device of claim 13, wherein the controller is further configured, in response to a second ECC procedure on the first set of corrected bit values indicating that the first set of corrected bit values is not correctable by the second ECC procedure, to:

instruct the memory to read the group of the storage elements using a third read voltage to obtain a third plurality of bit values;

compare the third plurality of bit values with the first plurality of bit values and the second plurality of bit values to identify a second set of bits having different values in at least one of the first plurality of bit values, the second plurality of bit values, or the third plurality of bit values; and change a bit value of one or more bits of the second set of bits to a majority value of the different values read in the first plurality of bit values, the second plurality of bit values, and the third plurality of bit values to generate a second set of corrected bit values.

17. The data storage device of claim 13, further comprising a read result storage area configured to store the first plurality of bit values and the second plurality of bit values.

18. The data storage device of claim 13, wherein the controller is further configured to select the second read voltage from a table of read voltages maintained by the controller.

19. The data storage device of claim 13, further comprising a comparator configured to identify the first set of bits having different values.

20. The data storage device of claim 13, wherein the controller is further configured to compare the first plurality of bit values with the second plurality of bit values by performing an exclusive-OR operation.

* * * * *